United States Patent
Tsai et al.

(10) Patent No.: US 9,076,762 B2
(45) Date of Patent: Jul. 7, 2015

(54) CONTACT STRUCTURE OF SEMICONDUCTOR DEVICE

(71) Applicant: Taiwan Semiconductor Manufacturing Company, Ltd., Hsin-Chu (TW)

(72) Inventors: Chun Hsiung Tsai, Xinpu Township (TW); Yan-Ting Lin, Baoshan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/093,268

(22) Filed: Nov. 29, 2013

(65) Prior Publication Data

US 2015/0155359 A1 Jun. 4, 2015

(51) Int. Cl.
| | |
|---|---|
| *H01L 21/02* | (2006.01) |
| *H01L 29/417* | (2006.01) |
| *H01L 29/66* | (2006.01) |
| *H01L 29/78* | (2006.01) |
| H01L 29/737 | (2006.01) |

(52) U.S. Cl.
CPC .... *H01L 29/41758* (2013.01); *H01L 29/66477* (2013.01); *H01L 29/7848* (2013.01); *H01L 29/7378* (2013.01)

(58) Field of Classification Search
CPC ............ H01L 29/7378; H01L 29/7848; H01L 31/1808; H01L 31/1812; H01L 31/204; H01L 2924/10271; H01L 29/7851; H01L 29/66795; H01L 29/0653; H01L 21/324
See application file for complete search history.

(56) References Cited

U.S. PATENT DOCUMENTS

| | | | |
|---|---|---|---|
| 6,878,606 B2 | 4/2005 | Ohnishi et al. | |
| 7,413,961 B2 * | 8/2008 | Chong et al. | 438/430 |
| 7,719,062 B2 * | 5/2010 | Fischer et al. | 257/382 |
| 7,754,571 B2 | 7/2010 | Liao et al. | |
| 8,110,877 B2 | 2/2012 | Mukherjee et al. | |
| 8,846,461 B2 * | 9/2014 | Lin et al. | 438/152 |
| 8,853,035 B2 * | 10/2014 | Yu et al. | 438/285 |
| 8,853,673 B2 * | 10/2014 | Shimamune et al. | 257/19 |
| 8,877,581 B2 * | 11/2014 | Jain et al. | 438/229 |
| 8,901,537 B2 * | 12/2014 | Murthy et al. | 257/19 |
| 2005/0032327 A1 | 2/2005 | Ohnishi et al. | |
| 2006/0128105 A1 | 6/2006 | Ouyang et al. | |
| 2007/0093051 A1 | 4/2007 | Miyoshi | |

(Continued)

FOREIGN PATENT DOCUMENTS

| | | |
|---|---|---|
| KR | 20000027908 | 5/2000 |
| KR | 20100088905 | 8/2010 |

(Continued)

*Primary Examiner* — Bilkis Jahan
(74) *Attorney, Agent, or Firm* — Slater & Matsil, L.L.P.

(57) ABSTRACT

The embodiments described above provide mechanisms of forming contact structures with low resistance. A strained material stack with multiple sub-layers is used to lower the Schottky barrier height (SBH) of the conductive layers underneath the contact structures. The strained material stack includes a SiGe main layer, a graded SiG layer, a GeB layer, a Ge layer, and a SiGe top layer. The GeB layer moves the Schottky barrier to an interface between GeB and a metal germanide, which greatly reduces the Schottky barrier height (SBH). The lower SBH, the Ge in the SiGe top layer forms metal germanide and high B concentration in the GeB layer help to reduce the resistance of the conductive layers underneath the contact structures.

20 Claims, 7 Drawing Sheets

(56) References Cited

U.S. PATENT DOCUMENTS

| | | |
|---|---|---|
| 2008/0157224 A1 | 7/2008 | Fischer et al. |
| 2010/0155846 A1 | 6/2010 | Mukherjee et al. |
| 2010/0197092 A1* | 8/2010 | Kim et al. ............... 438/229 |
| 2010/0276810 A1 | 11/2010 | Chang et al. |
| 2011/0079829 A1 | 4/2011 | Lai et al. |
| 2012/0049201 A1 | 3/2012 | Yamaguchi et al. |
| 2012/0068273 A1* | 3/2012 | Fischer et al. ............ 257/369 |
| 2013/0214363 A1 | 8/2013 | Nemouchi et al. |
| 2013/0260518 A1* | 10/2013 | Buss ........................ 438/199 |
| 2014/0084340 A1 | 3/2014 | Wang et al. |
| 2014/0363943 A1 | 12/2014 | Wang et al. |

FOREIGN PATENT DOCUMENTS

| | | |
|---|---|---|
| KR | 20110036505 | 4/2011 |
| KR | 20110084166 | 7/2011 |

\* cited by examiner

CONTACT STRUCTURE OF SEMICONDUCTOR DEVICE

CROSS-REFERENCE TO RELATED APPLICATIONS

This application relates to the following co-pending and commonly assigned patent application Ser. No. 13/672,258, filed on Nov. 8, 2012, entitled "Contact Structure of Semiconductor Device," which application is hereby incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs of a semiconductor device, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over three sides (e.g., wrapping) the fin. Having a gate on both sides of the channel allows gate control of the channel from both sides. Further advantages of FinFET comprise reducing the short channel effect and higher current flow.

However, there are challenges to implementation of such features and processes in complementary metal-oxide-semiconductor (CMOS) fabrication. For example, silicide formation on strained materials causes high contact resistance of source/drain regions of the FinFET, thereby degrading the device performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
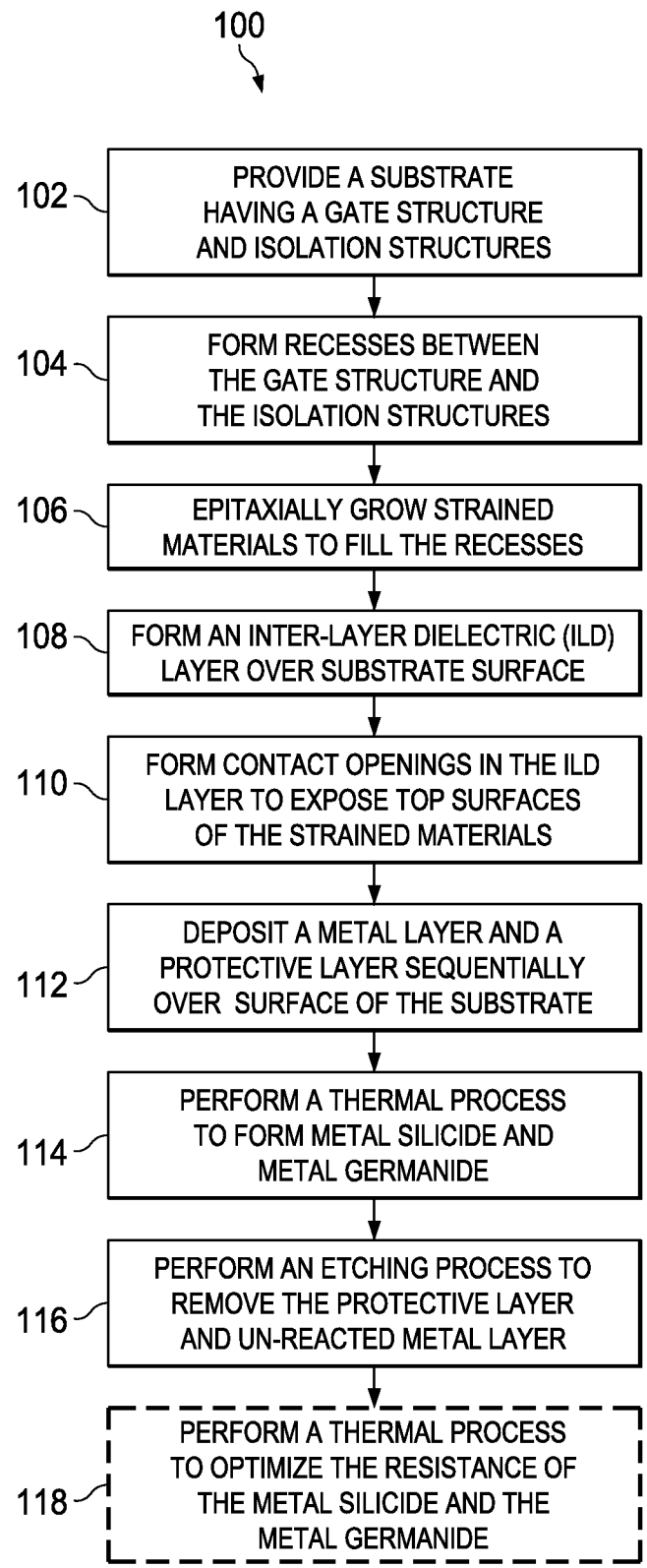
FIG. 1 is a flowchart illustrating a method of fabricating a contact structure of a semiconductor device according to various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a flowchart of a method 100 of fabricating a contact structure of a semiconductor device, in accordance with some embodiments. The method 100 begins with operation 102 in which a substrate comprising a gate structure and an isolation structure on each side of the gate structure. The method 100 continues with operation 104 in which recesses are formed between the gate structure and the isolation structures. After the recesses are formed, strained materials are epitaxially grown to fill the recesses at operation 106. The strain materials include materials with lattice constants different from a lattice constant of the substrate.

The method 100 then continues with operation 108 in which an inter-layer dielectric (ILD) layer is formed over the substrate to cover gate structure, the surfaces of filled recesses and isolation structures. The method 100 continues with operation 110 in which contact openings are formed in the ILD layer to expose top surfaces of the strained materials filling the recesses. Afterwards, the method 100 continues with operation 112 in which a metal layer and a protective layer are deposited over the surface of the substrate. The metal layer is deposited to line the contact openings and the protective layer is deposited over the metal layer.

The method 100 then continues with operation 114 in which the substrate undergoes a thermal process to form metal silicide and metal germanide (metal-Ge) compounds at the bottoms and areas surrounding the bottoms of the contact openings. The metal silicide and the metal germanide compounds are formed by the metal layer and silicon and germanium near the top surfaces of the strained materials that come in contact with the metal layer. Afterwards, the substrate undergoes an etching process to remove the protective layer and un-reacted metal layer at operation 116. An optional operation 118 is performed after operation 116 in some embodiments. Operation 118 is a thermal process used to optimize the resistance of the metal silicide and the metal germanide compounds formed around the bottom of the contact openings. Additional processing sequence is performed afterwards to complete the contact formation and to complete the formation of the integrated circuits.

FIGS. 2A-2H show schematic cross-sectional views of a semiconductor device 200 comprising a contact structure 230 at various stages of fabrication, in accordance with some embodiments. As employed in the present disclosure, the term semiconductor device 200 refers to a fin field effect transistor (FinFET). The FinFET refers to any fin-based, multi-gate transistor. In some alternative embodiments, the term semiconductor device 200 refers to a planar metal-oxide-semiconductor field effect transistor (MOSFET). Other transistor structures and analogous structures are within the contemplated scope of this disclosure. The semiconductor device 200 may be included in a microprocessor, memory cell, and/or other integrated circuit (IC).

It is noted that, in some embodiments, the operations mentioned in FIG. 1 do not produce a completed semiconductor device 200. A completed semiconductor device 200 may be fabricated using complementary metal-oxide-semiconductor (CMOS) technology processing. Accordingly, it is understood that additional processes may be provided before, during, and/or after the method 100 of FIG. 1, and that some other processes may only be briefly described herein. Also, FIGS. 2A through 2I are simplified for a better understanding of the concepts of the present disclosure. For example, although the figures illustrate the semiconductor device 200, it is understood the IC may comprise a number of other devices comprising resistors, capacitors, inductors, fuses, etc.

Figure 2A:
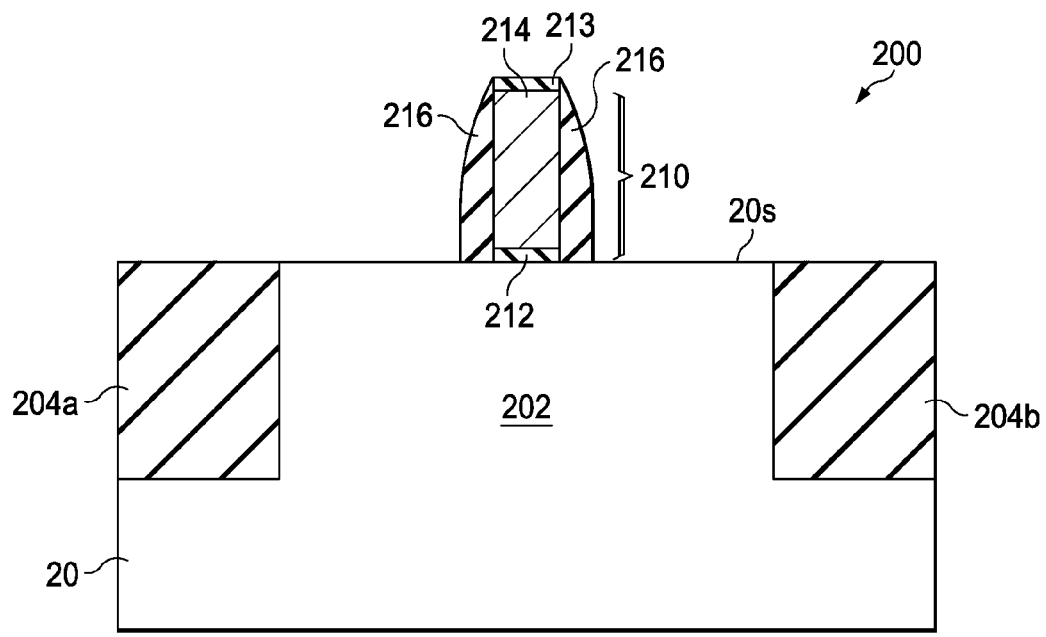
FIGS. 2A-2H are schematic cross-sectional views of a semiconductor device comprising a contact structure at various stages of fabrication according to various aspects of the present disclosure.

Referring to FIG. 2A and operation 102 in FIG. 1, a substrate 20 is provided. In at least one embodiment, the substrate 20 comprises a crystalline silicon substrate (e.g., wafer). The substrate 20 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for a p-type FinFET or planar MOSFET.

The substrate 20 may alternatively be made of some other suitable elementary semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 20 may include an epitaxial layer (epi-layer), may be strained for performance enhancement, and/or may include a silicon-on-insulator (SOI) structure.

In the depicted embodiment, the substrate 20 further comprises a fin structure 202. The fin structure 202, formed on the substrate 20, comprises one or more fins. In the present embodiment, for simplicity, the fin structure 202 comprises a single fin. The fin comprises any suitable material, for example, the fin may comprise silicon, germanium or compound semiconductor. The fin structure 202 may further comprise a capping layer (not shown) disposed on the fin, which may be a silicon-capping layer.

The fin structure 202 is formed using any suitable process comprising various deposition, photolithography, and/or etching processes. An exemplary photolithography process may include forming a photoresist layer (resist) overlying the substrate 20 (e.g., on a silicon layer), exposing the resist to a pattern, performing a post-exposure bake process, and developing the resist to form a masking element including the resist. The silicon layer may then be etched using reactive ion etching (RIE) processes and/or other suitable processes. In an example, silicon fins of the fin structure 202 may be formed using patterning and etching a portion of the silicon substrate 20. In another example, silicon fins of the fin structure 202 may be formed using patterning and etching a silicon layer deposited overlying an insulator layer (for example, an upper silicon layer of a silicon-insulator-silicon stack of an SOI substrate). In still other embodiments, the fin structure is formed by forming a dielectric layer above a substrate, opening trenches in the dielectric layer, and epitaxially growing fins from the substrate in the trenches to form the fins.

In the depicted embodiment, isolation structures 204a, 204b are formed within the substrate 20 to define and electrically isolate the various fins of the fin structure 202. In one example, the isolation structures 204a, 204b are shallow trench isolation (STI) structures. The isolation structures 204a, 204b may comprise silicon oxide, silicon nitride, silicon oxynitride, fluoride-doped silicate glass (FSG), a low-K dielectric material, and/or combinations thereof. The isolation structures 204a, 204b may be formed by any suitable process. As one example, the formation of the isolation structures 204a, 204b may include filling trenches between the fins (for example, using a chemical vapor deposition process) with a dielectric material. In some embodiments, the filled trench may have a multi-layer structure such as a thermal oxide liner layer filled with silicon nitride or silicon oxide.

Still referring to FIG. 2A, a gate stack 210 is formed on a surface 20s of substrate 20 (i.e., a top surface of the fin structure 202) in between the isolation structures 204a and 204b. Although in the plane illustrated in the Figures, gate stack 210 extends only on the top surface of the fin, those skilled in the art will recognize that in another plane of the device (not shown in the drawings) gate stack 210 extends along the sidewalls of fin structure 202. In some embodiments, the gate stack 210 comprises a gate dielectric layer 212 and a gate electrode layer 214 over the gate dielectric layer 212.

In some embodiments, a pair of sidewall spacers 216 is formed on two sides of the gate stack 210. In the depicted embodiment, the gate stack 210 may be formed using any suitable process, including the processes described herein. In some embodiments, a hard mask 213 is formed over gate stack 210. The hard mask 213 is made of silicon nitride, in some embodiments. However, other materials such as silicon carbide, silicon oxynitride, and the like may also be used.

In one example, the gate dielectric layer 212 and gate electrode layer 214 are sequentially deposited over the substrate 20. In some embodiments, the gate dielectric layer 212 may include silicon oxide, silicon nitride, silicon oxy-nitride, or high dielectric constant (high-k) dielectric. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In some embodiments, the gate dielectric layer 212 has a thickness in the range of about 10 angstroms to about 30 angstroms. The gate dielectric layer 212 may be formed using a suitable process such as atomic layer deposition (ALD), chemical vapor deposition (CVD), physical vapor deposition (PVD), thermal oxidation, UV-ozone oxidation, or combinations thereof. The gate dielectric layer 212 may further comprise an interfacial layer (not shown) to reduce damage between the gate dielectric layer 212 and the fin structure 202. The interfacial layer may comprise silicon oxide.

In some embodiments, the gate electrode layer 214 may comprise a single-layer or multilayer structure. In at least one embodiment, the gate electrode layer 214 comprises poly-silicon. Further, the gate electrode layer 214 may be doped poly-silicon with the uniform or non-uniform doping. In an alternative embodiment, the gate electrode layer 214 comprises a metal selected from a group of W, Cu, Ti, Ag, Al, TiAl, TiAlN, TaC, TaCN, TaSiN, Mn, and Zr. In an alternative embodiment, the gate electrode layer 214 comprises a metal selected from a group of TiN, WN, TaN, and Ru. In some embodiments, the gate electrode layer 214 has a thickness in the range of about 30 nm to about 60 nm. The gate electrode layer 214 may be formed using a suitable process such as ALD, CVD, PVD, plating, or combinations thereof.

Hard mask 213 may comprise silicon nitride, for example, although other materials such as silicon carbide, silicon oxynitride, and the like may also be used. In some embodiments, hard mask 213 has a thickness in the range of about 50 nm to about 100 nm. Hard mask 213 may be formed using a suitable process such as ALD, CVD, PVD, plating, or combinations thereof.

Afterwards, a layer of photoresist (not shown) is formed over the gate electrode layer 214 by a suitable process, such as spin-on coating, and patterned to form a patterned photoresist feature by a proper lithography patterning method. In at least one embodiment, a width of the patterned photoresist feature is in the range of about 5 nm to about 45 nm. The patterned photoresist feature can then be transferred using one or more etching processes to the underlying layers (i.e., the hard mask 213, the gate electrode layer 214 and the gate dielectric layer 212) to form the gate stack 210. The photoresist layer may be stripped thereafter.

Still referring to FIG. 2A, the semiconductor device 200 further comprises spacers 216 (a dielectric layer) formed on the sidewalls of the gate stack 210, in some embodiments. In some embodiments, each of gate spacers 216 includes a silicon oxide layer (not shown) and a silicon nitride layer over the silicon oxide layer, wherein the silicon oxide layer may have a thickness in a range between about 15 Å and about 50 Å, and the thickness of the silicon nitride layer may be in a range between about 50 Å and about 200 Å. In alternative embodiments, gate spacers 216 include one or more layers, each comprising silicon oxide, silicon nitride, silicon oxynitride, and/or other dielectric materials. The available formation methods include Plasma Enhanced Chemical Vapor Deposition (PECVD), Low-Pressure Chemical Vapor Deposition (LPCVD), Sub-Atmospheric Chemical Vapor Deposition (SACVD), and other deposition methods.

Figure 2B:
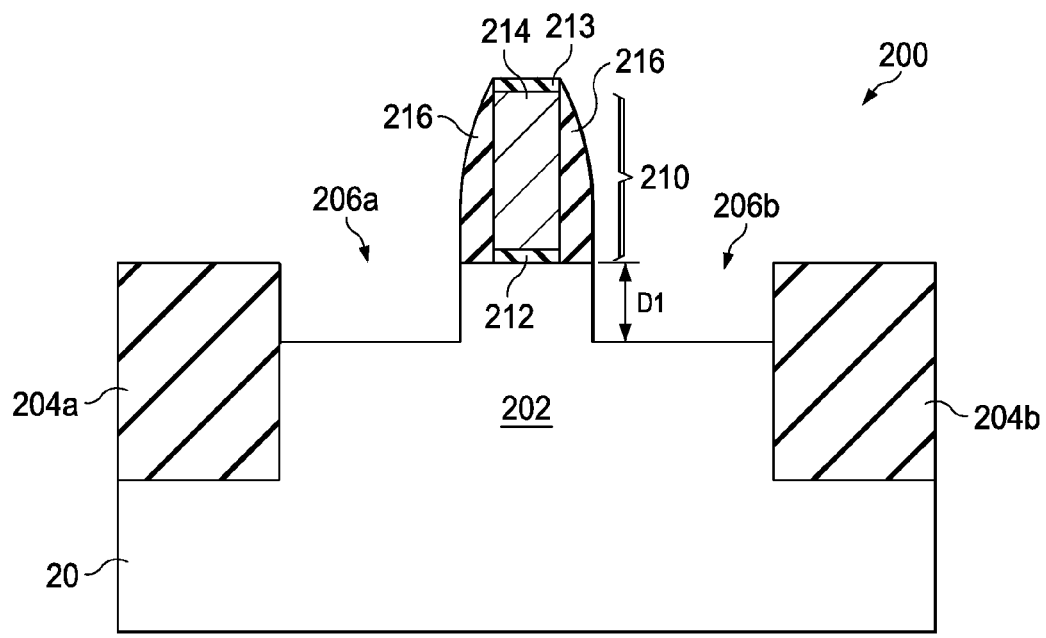

Referring to FIG. 2B and operation 104 in FIG. 1, portions of the fin structure 202 (other than where the gate stack 210 and the pair of sidewall spacers 216 are formed thereover) are etched to form source and drain (S/D) recesses 206a and 206b below surface 20s of the substrate 20 adjacent to the gate stack 210. As depicted in FIG. 2B, each of the S/D recesses 206a and 206b is between the gate stack 210 and one of the isolation structures 204a and 204b.

Using the gate stack 210 and the pair of sidewall spacers 216 as etching masks, an isotropic etch may be performed to form recesses 206a and 206b in substrate 20. The isotropic etch may be a dry etch, wherein the etching gas may be selected from $CF_4$, $Cl_2$, $NF_3$, $SF_6$, and combinations thereof. In alternative embodiments, the isotropic etch step described above is skipped. A wet etch is then performed to complete the formation of recesses 206a and 206b. The wet etching may be performed, for example, using Tetra-Methyl Ammonium Hydroxide (TMAH), a potassium hydroxide (KOH) solution, or the like. In some exemplary embodiments, the TMAH solution has a concentration in a range between about 1 percent and about 30 percent. After the wet etching, facets may be formed in recesses 206a and 206b. The facets include (111) planes of substrate 20, in some embodiments. In some exemplary embodiments, after the wet etching, depth D1 of recessed 206a and 206b is in a range between about 300 Å and about 800 Å.

Figure 2C:
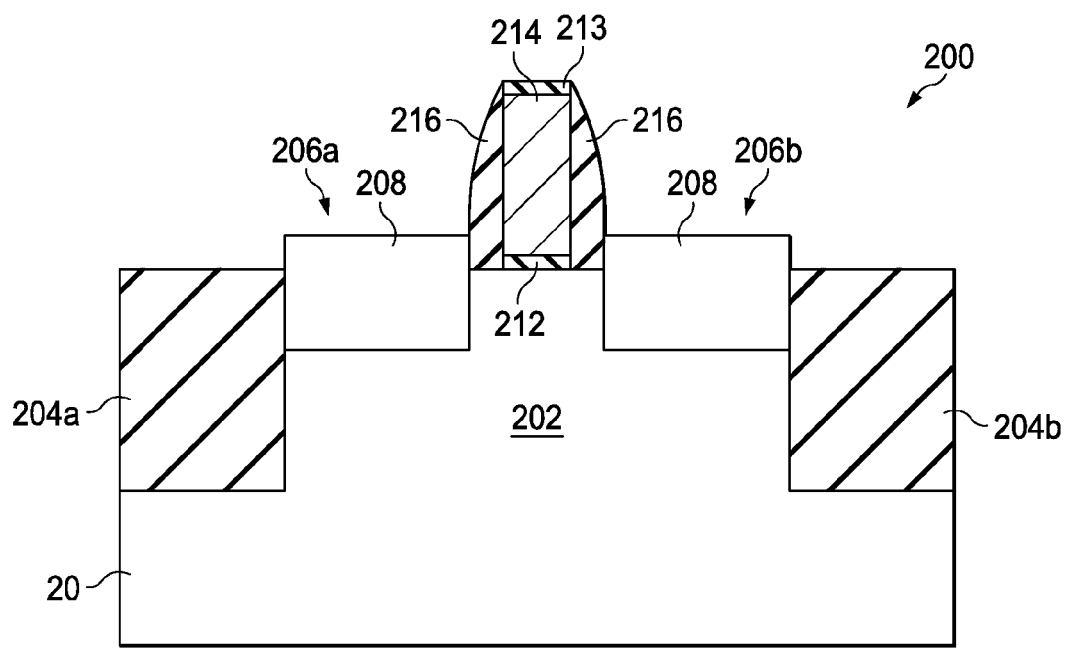

As shown in FIG. 2C and operation 106 in FIG. 1, after the formation of the S/D recesses 206a and 206b below surface 20s of the substrate 20, the recesses 206a and 206b of FIG. 2B are filled by epitaxially growing strained material stack 208. The lattice constants of the strained material stack 208 are different from a lattice constant of the substrate 20. As a result, the channel region of the semiconductor device 200 is strained or stressed to enhance carrier mobility of the device.

Figure 3:
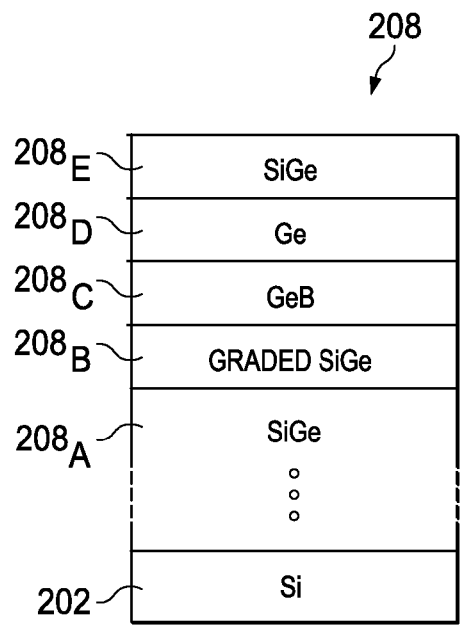
FIG. 3 shows the various strain materials in a strained material stack filling recesses next to a gate structure, in accordance with some embodiments.

In some embodiments, the strained material stack 208 comprises Si, Ge, SiGe, SiC, SiP, P-type dopant, or III-V semiconductor material. FIG. 3 shows the various strain materials in the strained material stack 208, in accordance with some embodiments. The various materials in the strained material stack 208 are all grown epitaxially. In some embodiments, the strained material stack 208 in FIG. 3 includes a first SiGe (silicon germanium) layer (or main SiGe layer) $208_A$, a graded SiGe layer $208_B$, a GeB (germanium doped with boron) layer $208_C$, an optional Ge layer $208_D$, and a second SiGe layer $208_E$. The first SiGe layer $208_A$ fills most of the recesses 206a and 206b. The various layers, $208_B$, $208_C$, $208_D$, and $208_E$, over the first SiGe layer assist the formation of the metal silicide and metal germanide compounds at the bottoms and areas surrounding the bottoms of the contact openings described above.

For advanced technologies, the critical dimension (CD) of contacts continues to decrease. Metal silicides have been used to provide connection between the S/D regions and contact plugs (or contacts) with low resistivity. Equation (1) shows the relationship between resistivity of a conductive material, such as a metal silicide or metal germanide, formed next to a semiconductive material and factors affecting resistivity.

$$\rho \propto \exp[C \times SQRT(m) \times \Phi_B / SQRT(N)] \qquad (1)$$

In equation (1), SQRT stands for square root. C is a constant and m is the atomic mass of a semiconductive material in the source and drain regions, such as Si or Ge. $\Phi_B$ is the Schottky barrier height (SBH) between the semiconductive material and the metal used to form the metal silicide or metal germanide. N is the dopant, such as B, concentration in the semiconductive material.

In order to reduce the resistivity, m and/or $\Phi_B$ can be reduced. In addition, N may also be increased. The atomic mass of Ge is lower than Si. Having Ge, instead of Si, present at the metal-silicide or metal germanide interface with the semiconductive material could reduce contact resistivity. The SBH ($\Phi_B$) for metal silicide, such as TiSi or NiSi, formed between metal, such as Ti, or Ni, and SiGeB is about 0.6 eV. In contrast, the SBH between NiGe and GeB can be reduced about 0.1 eV. Therefore, it's desirable to have the Shottky barrier formed between metal-Ge, such as NiGe or other metal-Ge, and GeB. Further the dopant, such as B, concentration in the semiconductor material, such as GeB, should be maintained high to increase N value.

The graded SiGe layer $208_B$ is needed to prevent substrate Si/EPI SiGe lattice mismatch induced dislocation. The GeB layer $208_C$ enables lowering the SBH, which will be explained below. The optional Ge layer $208_D$ could reduce the risk of Galvanic corrosion. The second SiGe layer $208_E$ forms a metal-SiGe layer that would protect the metal germanide layer that will be formed after a thermal anneal from being removed during a subsequent wet etching process to removed un-reacted metal.

In some embodiments, a pre-cleaning process is performed to clean the S/D recesses 206a and 206b with an HF solution or other suitable solution prior to forming the strained material stack 208. Afterwards, the strained materials 208 are sequentially and selectively grown by low-pressure CVD (LPCVD) processes to fill the S/D recesses 206a and 206b. In some embodiments, the LPCVD processes are performed at temperatures in ranges from about 400 to about 800° C. and under pressures in ranges from about 1 to about 15 Torr. The reaction gases used to form the strain material stack 208 include various combinations of SiH4, $SiH_2Cl_2$, HCl, $GeH_4$, $Ge_2H_6$, $B_2H_6$, and $H_2$, in some embodiments.

The first SiGe (silicon germanium) layer $208_A$ is formed on the substrate surfaces of recesses 206a and 206b. In some embodiments, the Ge concentration (atomic %) in the first SiGe layer $208_A$ is in a range from about 15% to about 30%. In some embodiments, the thickness of the first SiGe layer $208_A$ is in a range from about 15 nm to about 30 nm.

The graded SiGe layer $208_B$ is then formed over the first SiGe layer $208_A$. The concentration of Ge in the graded SiGe layer $208_B$ increases from the concentration of Ge in the first SiGe layer $208_A$ to a higher value that is closer to the concentration of Ge in the GeB layer 208. In some embodiments, the concentration of Ge in the graded SiGe layer $208_B$ increases in a range from about 30% to about 80% from bottom to top of the layer. In some embodiments, the thickness of the graded SiGe layer $208_B$ is in a range from about 15 nm to about 30 nm.

As mentioned above, a Schottky bather will be formed at the interface between GeB and the metal-Ge layer formed over GeB after thermal anneal. In order to lower the resistivity of the metal-silicide and metal germanide compounds, the B concentration of the GeB layer $208_C$ should be as high as possible. In some embodiments, the B concentration is in a range from about 4E20 atoms/cm$^3$ to about 1E21 atoms/cm$^3$. To increase the B dopant density, the reactive gas mixture for forming the GeB layer includes Ge$_2$H$_6$, in some embodiments. In some embodiments, the thickness of the GeB layer $208_C$ is in a range from about 8 nm to about 20 nm.

The optional Ge layer $208_D$ is formed to prevent or reduce Galvanic corrosion cause by the difference in chemical potential between GeB layer $208_C$ (doped Ge layer) and the metal germanide layer formed over the GeB layer $208_C$ after the thermal anneal. In some embodiments, the thickness of the Ge layer $208_D$ is in a range from about 15 nm to about 35 nm.

The second SiGe layer $208_E$ is deposited over either the Ge layer $208_D$, if it exists, or the GeB layer 208, if the Ge layer $208_D$ does not exist, to form a protective layer over the metal-germanide underneath from subsequent wet etching. In some embodiments, the thickness of the second SiGe layer $208_E$ is in a range from about 1 nm to about 10 nm. In some embodiments, the various layers in strained material stack 208 are formed in the same process chamber. However, it is possible to form these various layers in more than one chambers.

Figure 2D:
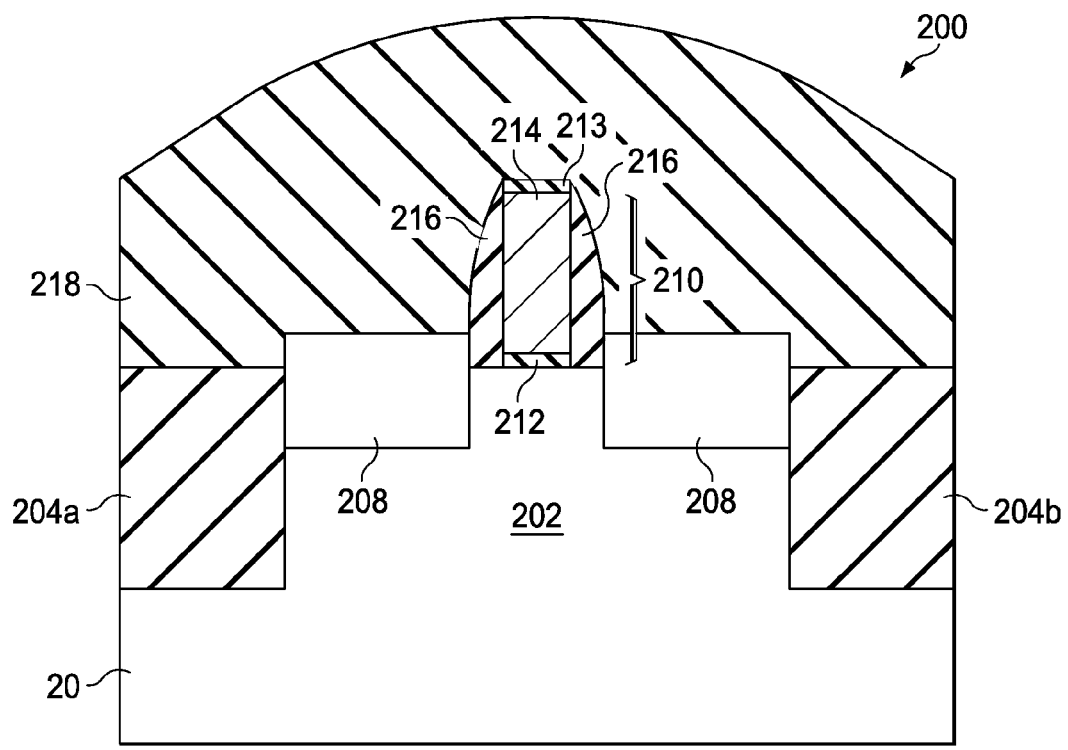
Figure 2E:
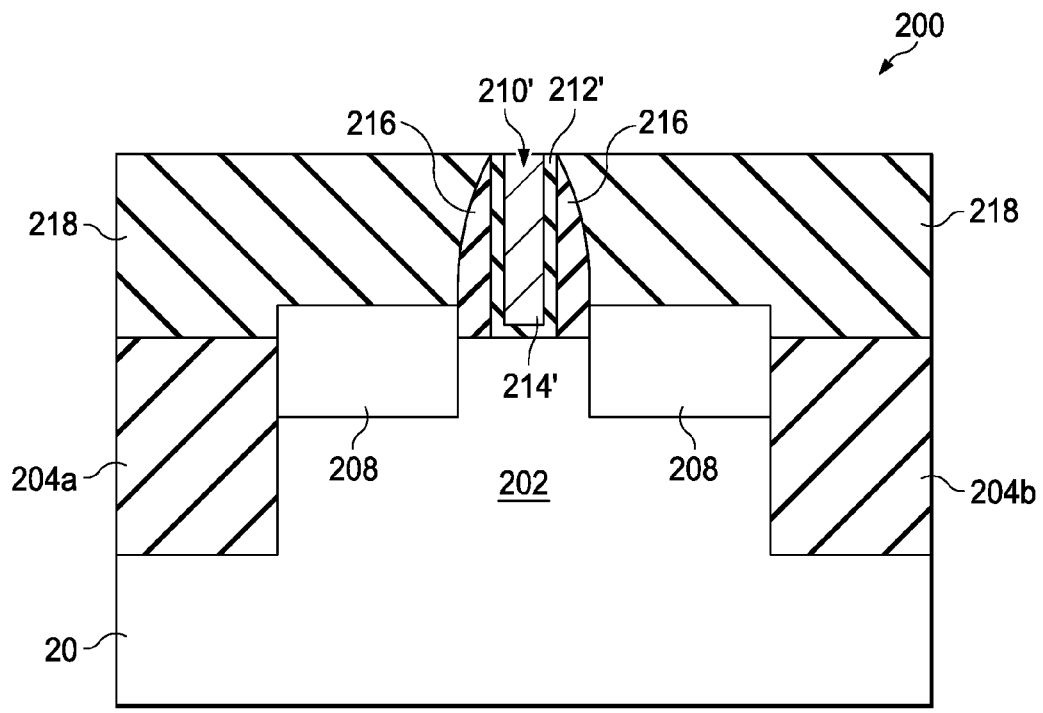

The process operations up to this point have provided the substrate 20 with the strained stack 208 in the S/D trenches 206a and 206b. As depicted in FIGS. 2D and 2E and operation 108 in FIG. 1, an inter-layer dielectric (ILD) layer 218 is deposited over the strained material stack 208, the gate stack 210, the pair of sidewall spacers 216 and the isolation regions 204a and 204b. The ILD layer 218 comprises a dielectric material. The dielectric material may comprise silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), and/or combinations thereof. In some embodiments, the ILD layer 218 may be formed over the strained material 208 by CVD, high density plasma (HDP) CVD, sub-atmospheric CVD (SACVD), spin-on, sputtering, or other suitable methods. In the present embodiment, the ILD layer 218 has a thickness in the range of about 4000 Å to about 8000 Å. It is understood that the ILD layer 218 may comprise one or more dielectric materials and/or one or more dielectric layers.

Subsequently, the ILD layer 218 is planarized using a chemical-mechanical polishing (CMP) process until the hard mask 213 is removed, in accordance with some embodiments. After the hard mask is removed, a replacement gate is formed to replace gate dielectric layer 212 and gate electrode layer 214 in accordance with some embodiments, as shown in FIG. 2E. In alternative embodiments, gate dielectric layer 212 and gate electrode layer 214 are not replaced with replacement gate stack 210'. In the embodiments the replacement gate stack 210' is formed, gate dielectric layer 212 and gate electrode layer 214 acts as dummy gate stack. FIG. 2E illustrates an exemplary structure including the replacement gate stack 210'. In some embodiments, a gate dielectric layer 212' and a gate electrode layer 214' are sequentially deposited to fill the openings left by the removed dummy gate stack, followed by a CMP to remove excess portions of the gate dielectric layer 212' and the gate electrode layer 214'. The remaining replacement gates include gate dielectric layer 212' and gate electrode layer 214'. Gate dielectric layer 212' may comprise a high-k dielectric material with a k value greater than about 7.0, for example, and gate electrode layer 214' may comprise a metal or a metal alloy.

Figure 2F:
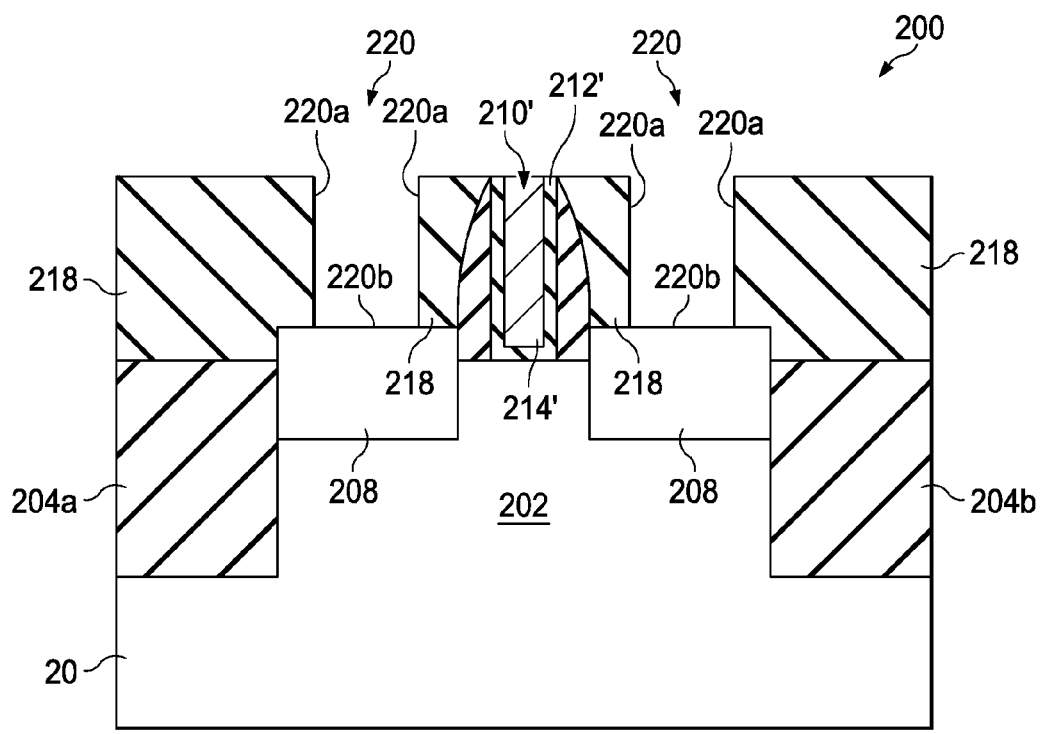

Subsequent CMOS processing steps applied to the semiconductor device 200 of FIG. 2E comprise forming contact opening through the ILD layer 218 to provide electrical contacts to S/D regions of the semiconductor device 200. Referring to FIG. 2F, the structure in FIG. 2F is produced by forming openings 220 in the ILD layer 218 to expose a portion of the strained material stack 208. The process is described in operation 110 in FIG. 1. As one example, the formation of the openings 220 includes forming a layer of photoresist (not shown) over the ILD layer 218 by a suitable process, such as spin-on coating, patterning the layer of photoresist to form a patterned photoresist feature by a proper lithography method, etching the exposed ILD layer 218 (for example, by using a dry etching, wet etching, and/or plasma etching process) to remove portions of the ILD layer 218 to expose a portion of the strained material 208. As such, the openings 220 are over the strained material 208, wherein the openings 220 comprise sidewalls 220a of ILD layer 218 and a bottom 220b in contact with the top surfaces of the strained material stack 208. The patterned photoresist layer may be stripped thereafter.

Figure 4A:
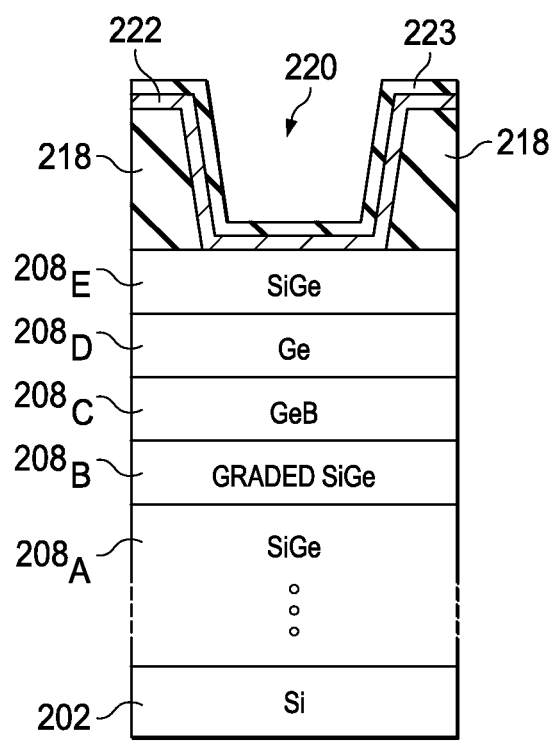
FIGS. 4A-4C are expanded cross-section views of a portion of the contact structure at various stages of fabrication according to various aspects of the present disclosure.

After the openings 220 are formed, a conductive layer is formed at the bottoms of openings 220, in accordance with some embodiments. As described in operation 112 in FIG. 1, after formation of the opening 220 in the ILD layer 218, a metal layer 222 is deposited to coat the interior of openings 220 and a protective layer 223 is deposited over the metal layer 222. FIG. 4A shows a schematic and cross-sectional view of material layers near an opening 220 after the deposition of the metal layer 222 and the protective layer 223, in accordance with some embodiments. The metal layer 222 may be made of various types of metal that form metal-silicide with Si and/or metal germanide with Ge after a thermal process (or thermal anneal). In some embodiments, the metal is made of Ti, Al, Mo, Zr, Hf, Ta, In, Ni, Be, Mg, Ca, Y, Ba, Sr, Sc, or Ga. In FIG. 4A, Ni is used as an example for the metal layer 222. The protective layer 223 protects the metal layer 222 from being oxidized during the subsequent thermal process (or annealing process). The protective layer 223 should be thermally stable, such as up to 900° C. In addition, the protective layer 223 should adhere well to metal layer 222. In some embodiments, the protective layer 223 is made of TiN, TaN, or a combination thereof. In FIG. 4A, TiN is used as an example for the metal layer 223. Each of layers 222 and 223 may be formed by PVD, CVD, ALD, or other applicable processes. In some embodiments, the metal layer 222 has a thickness in a range from about 5 nm to about 15 nm. In some embodiments, the protective layer 223 has a thickness in a range from about 5 nm to about 20 nm.

In one embodiment, an upper surface of the strained material stack 208 is lower than the major surface 20s (not shown). In another embodiment, the strained material stack 208 filling the S/D recesses 206 extends upward over the surface 20s (not shown).

As described in operation 114 in FIG. 1, after layers 222 and 223 are deposited, a thermal process (or annealing process) at operation 114 is performed to form metal silicide and metal germanide compounds at the bottoms and areas surrounding the bottoms of the contact openings. In some embodiments, the thermal process is a rapid thermal annealing (RTA) process. The temperature is in a range from about 150° C. to about 300° C. In some embodiments, the duration of the RTA process is in a range from about 20 seconds to about 100 seconds.

Figure 4B:
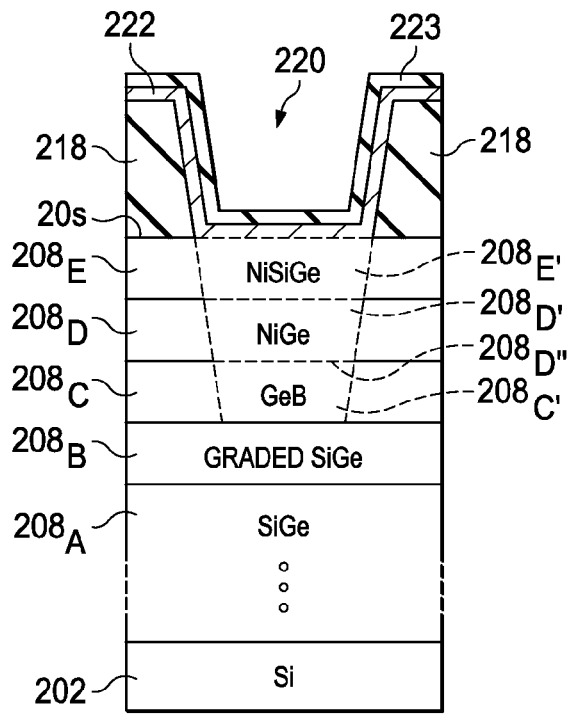

FIG. 4B shows a schematic and cross-sectional view of material layers of FIG. 4A after the thermal process of operation 114, in accordance with some embodiments. In the embodiments in FIGS. 4A and 4B, the metal in the metal layer 222 is made of Ni. During the thermal process, the Ni in metal layer 222 diffuses to the second SiGe layer $208_E$ to become Ni-doped SiGe (or NiSiGe) layer $208_E'$, after the thermal process. In some embodiments, the thickness of the NiSiGe layer $208_E'$ is in a range from about 1 nm to about 10 nm. Ni-doped SiGe (or NiSiGe) layer $208_E'$ only occupies the region near the bottom of contact opening 220. The remaining portion of the second SiGe layer $208_E$ is unchanged.

Some of the Ni from metal layer 222 diffuses past the second SiGe layer $208_E$ to come in contact with Ge layer $208_D$ to form Ni-doped Ge (or NiGe, nickel germanide) layer $208_D'$. As noted in FIG. 4B, the NiGe layer $208_D'$ is formed mostly directly under the bottom of contact opening 220. The Ge layer $208_D$ away from the bottom of contact opening 220 remains unchanged. An ultra-thin Ge layer $208_D''$ exists between NiGe layer $208_D'$ and GeB layer $208_B'$. In some embodiments, the ultra-thin Ge layer $208_D''$ underneath the NiGe layer $208_D$ has a thickness in a range from about 2 Å to about 10 Å. GeB layer 208' might go through some minor changes with some Ge moving upward to the Ge layer $208_D'$ to form NiGe with Ni from metal layer 222. The graded SiGe layer $208_B'$ remains substantially similar to graded SiGe layer $208_B$ in some embodiments. The first SiGe layer $208_A$ also remains substantially unchanged, in some embodiments. Both NiSiGe layer $208_E'$ and NiGe layer $208_D$ are conductive.

Figure 4C:
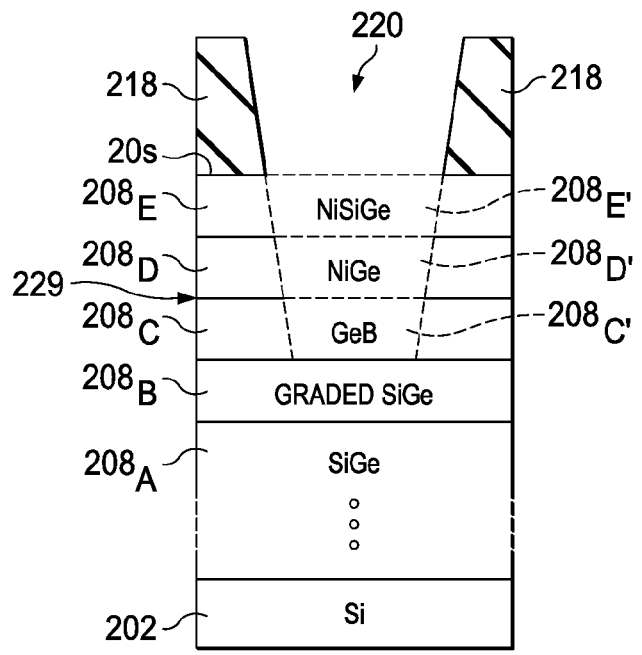

As described in operation 116 in FIG. 1, after the thermal process of operation 114, an etching operation 116 is performed to remove protective layer 223 and un-reacted metal layer 222. In some embodiments, a wet etch process is used in the etching operation 116. In some embodiments, the wet etch process utilizes $H_2SO_4$ and $H_2O_2$. In some embodiments, the etch process also includes $FeCl_3$ in the etching chemistry. FIG. 4C shows the structure of FIG. 4B after the wet etch process, in accordance with some embodiments. FIG. 4C shows that the protective layer 223 and un-re-reacted metal layer 222 are removed. In some embodiments, a portion of NiSiGe layer 208E' rises above the bottom surface 224 of contact opening 220. In some embodiments, the NiSiGe layer $208_E'$ is in an "U" shape and the top surface of the NiSiGe layer $208_E'$ extends above the surface 20s. The ultra-thin Ge layer $208_D''$ that exists between NiGe layer 208D' and GeB layer $208_B'$ prevents or reduces Galvanic corrosion due to the difference in chemical potential between NiGe and GeB during the wet etching process. However, the ultra-thin Ge layer $208_D''$ eventually disappears due to subsequent thermal processes. The Ge in the ultra-thin Ge layer $208_D''$ either moves into the NiGe layer $208_D'$ or into GeB layer $208_B'$, or both and becomes part of layers $208_D'$ and $208_B'$.

As described in operation 118 in FIG. 1, after a wet etching process of operation 116, another thermal process is performed to optimize the resistance of the metal silicide and the metal germanide compounds formed around the bottom of the contact openings. In some embodiments, the thermal process is a rapid thermal annealing (RTA) process. The temperature is in a range from about 150° C. to about 300° C. In some embodiments, the duration of the RTA process is in a range from about 20 seconds to about 100 seconds. In some embodiments, operation 116 is omitted.

FIG. 4C shows an interface 229 between semiconductive GeB layer $208_C$ and conductive NiGe layer $208_D'$. Interface 229 is the location of a Schottky barrier. As described above, the SBH between NiGe (metal-Ge) and GeB is lower than NiSi (metal-Si) and SiGeB, which reduces the resistance of the metal-Ge (or metal geraminde). Using Ge as the main component of the semiconductive layer and keeping the B concentration in the GeB layer high also help to reduce the resistance of metal-Ge. In consequence, the contact resistance can be lowered. The embodiments described above use Ni as the metal layer. Besides Ni, other types of metals, such as Ti, Mo, Au, Ag, etc., may also be used.

Figure 2G:
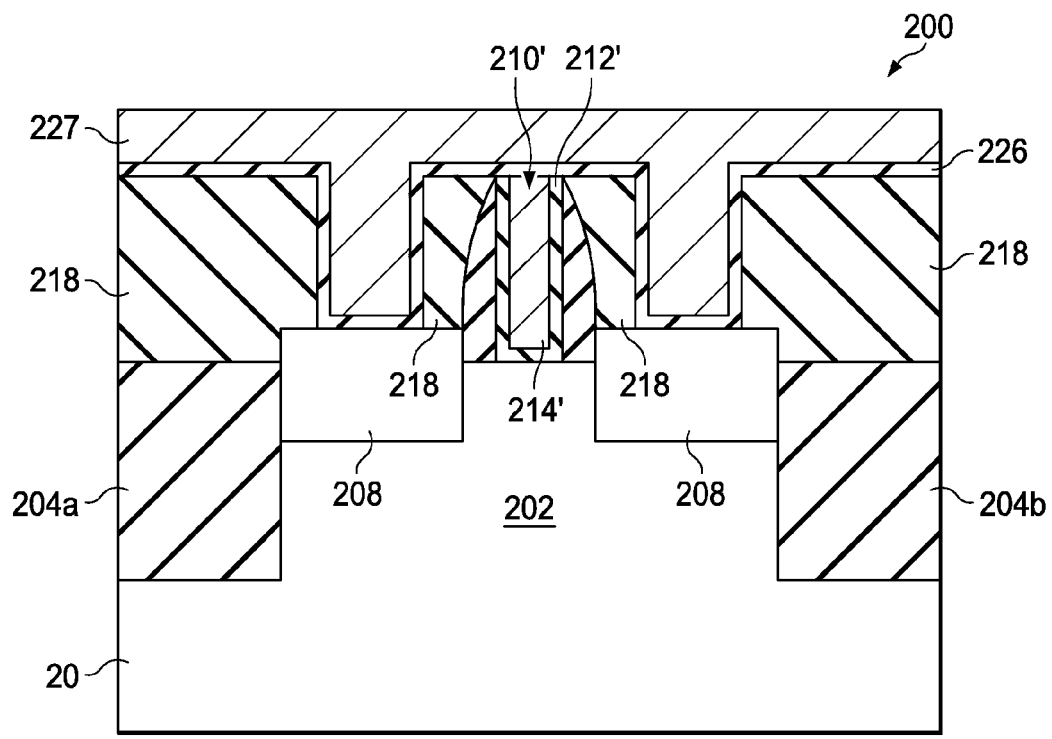

As described above, additional processing sequences are performed afterwards to complete the contact formation. FIG. 2G shows a barrier layer 226 to line the contact openings 220 and a conductive layer 227 are deposited afterwards to fill the contact openings 220, in accordance with some embodiments. The barrier layer 226 could promote adhesion between the conductive layer 227 and ILD layer 218. In addition, if the conductive layer 227 is made of diffusive element, such as Cu, the barrier layer 226 can block its diffusion into neighboring layers or structures. In some embodiments, the barrier layer 226 includes Ti, TiN, Ta, TaN, or combinations thereof. The barrier layer 226 may be formed by PVD, ALD, or other applicable processes. In some embodiments, the thickness of layer 226 is in a range from about 1 nm to about 10 nm. The barrier layer 126 comes in contact with NiSiGe layer $208_A'$ at the bottom of contact opening.

The conductive layer 227 may be made of any conductive metal or metal alloy. Examples of conductive metal suitable for layer 227 includes, but are not limited to, Cu, Al, W, Pt, Au, Ag, etc. The conductive layer 227 may be formed by plating, PVD, ALD, or other applicable processes. In some embodiments, the thickness of layer 227 is in a range from about 100 nm to about 200 nm.

Figure 2H:
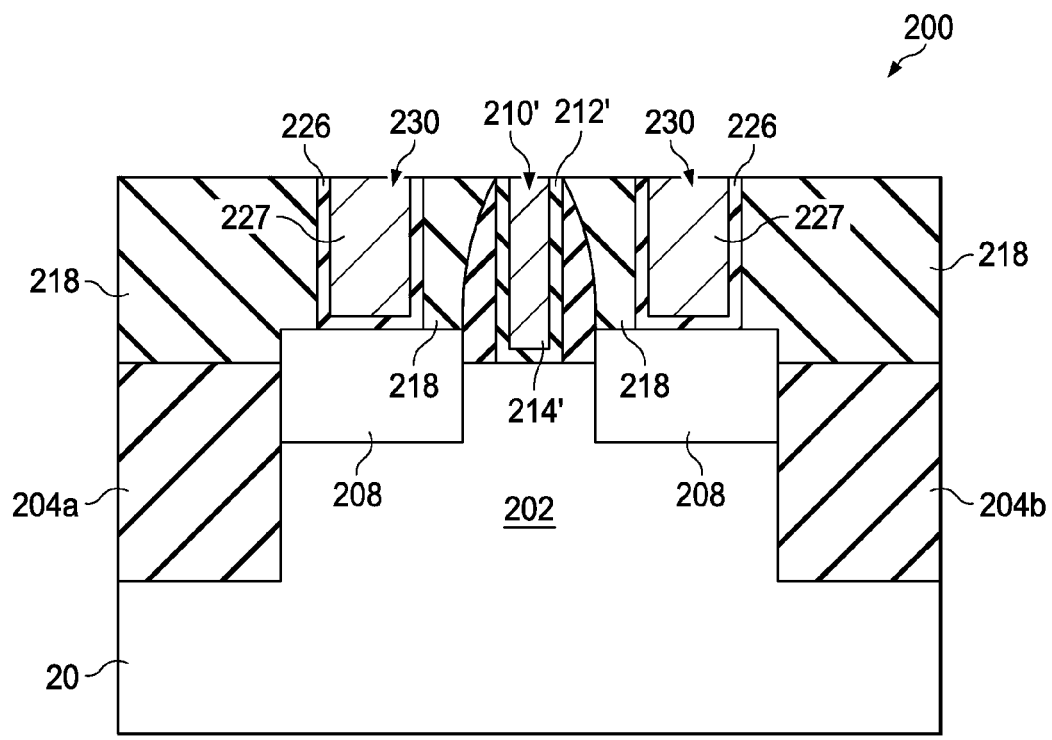

After the contact openings 220 are filled, a planarization process, such as chemical mechanical polishing (CMP) process, is performed to remove barrier layer 226 and conductive layer 227 outside contact openings 220. FIG. 2H shows barrier layer 226 and conductive layer 227 outside contact openings 220 removed by the planarization process. The remaining barrier layer 226 and conductive layer 227 in the contact opening form the contact structures (or contact plugs) 230. With the resistance of the conductive layers, such as NiSiGe layer $208_E'$ and NiGe layer $208_D'$, underneath the contact structures 230 being lowered by using the mechanism described above, the overall contact resistance is significantly lowered.

After the steps shown in FIG. 1, as further illustrated with respect to the example depicted in FIGS. 2A-2H, have been performed, subsequent processes, comprising interconnect processing, are performed to complete the semiconductor device 200 fabrication.

In the depicted embodiments, the replacement gate stack 210' is formed by a gate-last process. In alternative embodiments, gate stack 210 is maintained (gate-first).

The embodiments described above provide mechanisms of forming contact structures with low resistance. A strained material stack with multiple sub-layers is used to lower the Schottky barrier height (SBH) of the conductive layers underneath the contact structures. The strained material stack includes a SiGe main layer, a graded SiG layer, a GeB layer, a Ge layer, and a SiGe top layer. The GeB layer moves the Schottky barrier to an interface between GeB and a metal germanide, which greatly reduces the Schottky barrier height (SBH). The lower SBH, the Ge in the SiGe top layer forms metal germanide and high B concentration in the GeB layer help to reduce the resistance of the conductive layers underneath the contact structures.

In accordance with some embodiments, a semiconductor device structure is provided. The semiconductor device structure includes a gate structure formed over a surface of a semiconductor substrate and a recess neighboring the gate structure. The recess is formed below the surface of the semiconductor substrate. The semiconductor device structure also includes a strained material stack filling the recess, and lattice constants of materials in the strained material stack are different from a lattice constant of the substrate. The strain material stack comprises a boron-doped (B-doped) germanium (GeB) layer, a metal-Ge layer, and a metal-SiGe layer. The semiconductor device structure further includes a contact structure formed in an inter-layer dielectric (ILD) layer, and bottom portion of the contact structure contacts the metal-SiGe layer.

In accordance with some other embodiments, a semiconductor device structure is provided. The semiconductor device structure includes a gate structure formed over a surface of a semiconductor substrate, and a recess neighboring the gate structure. The recess is formed below the surface of the semiconductor substrate. The semiconductor device structure also includes a strained material stack filling the recess. The strain material stack comprises a SiGe layer, a graded SiGe layer, a boron-doped (B-doped) germanium (GeB) layer, a metal-Ge layer, and a metal-SiGe layer. The semiconductor device structure further includes a contact structure formed in an inter-layer dielectric (ILD) layer, and bottom portion of the contact structure contacts the metal-SiGe layer.

In accordance with yet some other embodiments, a method of forming a semiconductor device structure is provided. The method includes forming a gate structure formed over a surface of a semiconductor substrate, and forming a recess neighboring the gate structure. The recess is formed below the surface of the semiconductor substrate. The method also includes forming a strained material stack filling the recess. The strain material stack comprises a first SiGe layer, a graded SiGe layer, a boron-doped (B-doped) germanium (GeB) layer, a Ge layer, and a second SiGe layer.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed:

1. A semiconductor device structure, comprising:
   a gate structure formed over a surface of a semiconductor substrate;
   a recess neighboring the gate structure, wherein the recess is formed below the surface of the semiconductor substrate;
   a strained material stack filling the recess, wherein lattice constants of materials in the strained material stack are different from a lattice constant of the substrate, wherein the strain material stack comprises a boron-doped (B-doped) germanium (GeB) layer, a metal-Ge layer, and a metal-SiGe layer; and
   a contact structure formed in an inter-layer dielectric (ILD) layer, wherein bottom portion of the contact structure contacts the metal-SiGe layer.

2. The semiconductor device structure of claim 1, wherein the semiconductor substrate comprises silicon.

3. The semiconductor device structure of claim 1, wherein boron concentration of the GeB layer is in a range from about 1E20 atoms/cm3 to about 4E20 atoms/cm3.

4. The semiconductor device structure of claim 1, wherein the metallic element in the metal-Ge layer and in the metal-SiGe layer are the same.

5. The semiconductor device structure of claim 1, wherein the metallic element in the metal-Ge layer and in the metal-SiGe layer is selected from a group consisting of Ti, Al, Mo, Zr, Hf, Ta, In, Ni, Be, Mg, Ca, Y, Ba, Sr, Sc, and Ga.

6. The semiconductor device structure of claim 1, wherein the strained material stack extends upward above the surface of the semiconductor substrate.

7. The semiconductor device structure of claim 1, a depth of the recess is in a range between about 300 Å and about 800 Å.

8. The semiconductor device structure of claim 1, wherein the gate structure is a replacement gate.

9. The semiconductor device structure of claim 1, wherein the gate structure is formed over a fin of the semiconductor substrate.

10. The semiconductor device structure of claim 1, wherein layers of the strain material stack have crystals structures aligned to a crystal structure of the semiconductor substrate.

11. The semiconductor device structure of claim 1, wherein the strain material stack further comprises a SiGe layer, wherein a main portion of the recess is filled with the SiGe layer, wherein the SiGe layer fills a bottom portion of the recess.

12. The semiconductor device structure of claim 11, wherein the strain material stack further comprises a graded SiGe layer over the SiGe layer.

13. The semiconductor device structure of claim 12, wherein Ge concentration of the graded SiGe layer increases in a range from about 30% to about 80% from bottom to top of the graded SiGe layer.

14. A semiconductor device structure, comprising:
   a gate structure formed over a surface of a semiconductor substrate;
   a recess neighboring the gate structure, wherein the recess is formed below the surface of the semiconductor substrate;
   a strained material stack filling the recess, wherein the strain material stack comprises a SiGe layer, a graded SiGe layer, a boron-doped (B-doped) germanium (GeB) layer, a metal-Ge layer, and a metal-SiGe layer; and
   a contact structure formed in an inter-layer dielectric (ILD) layer, wherein bottom portion of the contact structure contacts the metal-SiGe layer.

15. The semiconductor device structure of claim 14, further including a silicon layer underlying the SiGe layer.

16. The semiconductor device structure of claim 14, wherein the metallic element in the metal-Ge layer and in the metal-SiGe layer is selected from a group consisting of Ti, Al, Mo, Zr, Hf, Ta, In, Ni, Be, Mg, Ca, Y, Ba, Sr, Sc, and Ga.

17. The semiconductor device structure of claim 14, wherein the strained material stack extends upward above the surface of the semiconductor substrate.

18. A semiconductor device structure, comprising:
- a semiconductor fin extending from a surface of a semiconductor substrate, the semiconductor fin and the semiconductor substrate formed of a first semiconductor material;
- a gate structure formed over a top surface and respective sidewalls of the semiconductor fin;
- a first recess adjacent a first side of the structure and extending below the top surface of the semiconductor fin; and
- a first strained material stack filling the recess, the strain material stack including a first layer of a boron-doped (B-doped) layer of second semiconductor material different from the first semiconductor material, a second layer of a metal doped layer of the second semiconductor material on the first layer, and a metal-doped layer of an alloy of the first and second semiconductor material on the second layer.

19. The semiconductor device structure of claim 18, further comprising a contact structure contacting the metal-doped layer of an alloy of the first and second semiconductor material.

20. The semiconductor device structure of claim 18, wherein the first semiconductor material comprises silicon and the second semiconductor material comprises germanium.

* * * * *